United States Patent
Lai

(10) Patent No.: US 9,082,511 B2
(45) Date of Patent: Jul. 14, 2015

(54) REDUNDANCY EVALUATION CIRCUIT FOR SEMICONDUCTOR DEVICE

(71) Applicant: ELITE SEMICONDUCTOR MEMORY TECHNOLOGY INC., Hsinchu (TW)

(72) Inventor: Ya-Chun Lai, Changhua County (TW)

(73) Assignee: ELITE SEMICONDUCTOR MEMORY TECHNOLOGY INC., Hsinchu (TW)

( * ) Notice: Subject to any disclaimer, the term of this patent is extended or adjusted under 35 U.S.C. 154(b) by 162 days.

(21) Appl. No.: 13/912,827

(22) Filed: Jun. 7, 2013

(65) Prior Publication Data

US 2014/0362654 A1    Dec. 11, 2014

(51) Int. Cl.
| | |
|---|---|
| G11C 29/02 | (2006.01) |
| G11C 29/00 | (2006.01) |
| G11C 29/44 | (2006.01) |

(52) U.S. Cl.
CPC ............ G11C 29/027 (2013.01); G11C 29/785 (2013.01); G11C 29/787 (2013.01); G11C 29/80 (2013.01); G11C 29/806 (2013.01); G11C 2029/4402 (2013.01)

(58) Field of Classification Search
CPC .... G11C 29/785; G11C 29/787; G11C 29/80; G11C 29/806

USPC ................................................ 365/200, 225.7
See application file for complete search history.

(56) References Cited

U.S. PATENT DOCUMENTS

| | | | | |
|---|---|---|---|---|
| 5,487,040 | A | * | 1/1996 | Sukegawa et al. ............ 365/200 |
| 5,508,963 | A | * | 4/1996 | Sawada et al. ................ 365/200 |
| 5,768,197 | A | * | 6/1998 | Choi ............................. 365/200 |
| 5,862,087 | A | | 1/1999 | Lee |
| 6,067,268 | A | * | 5/2000 | Lee ............................ 365/225.7 |
| 6,191,982 | B1 | | 2/2001 | Morgan |
| 6,262,923 | B1 | * | 7/2001 | Fujita ............................ 365/200 |
| 7,075,848 | B2 | | 7/2006 | Choi |
| 2002/0093860 | A1 | | 7/2002 | Kato |

\* cited by examiner

*Primary Examiner* — Vanthu Nguyen
(74) *Attorney, Agent, or Firm* — Li & Cai Intellectual Property (USA) Office

(57) ABSTRACT

A redundancy evaluation circuit has (m+1) fuse boxes and a comparator, wherein the m fuse box output a fuse status address signal and the other one fuse box outputs a comparator enable signal. Each fuse box has a common stage circuit and k redundant cells. The k redundant cells shares the precharge transistor and an inverted latch of the common stage circuit, and the fuse in the selected redundant cell affects the output of the corresponding fuse box. The comparator enabled by the comparator enable signal compares the fuse status address signal and a defective element address signal to generate a redundancy enable signal. The redundancy evaluation circuit has a small layout area.

8 Claims, 4 Drawing Sheets

REDUNDANCY EVALUATION CIRCUIT FOR SEMICONDUCTOR DEVICE

BACKGROUND

1. Technical Field

The present disclosure relates to a semiconductor device, in particular, to a redundancy evaluation circuit for the semiconductor device.

2. Description of Related Art

Technological advances have permitted semiconductor integrated circuits to comprise significantly more circuit elements in a given silicon area. Reducing and eliminating defects in the circuit elements has, however, becomes increasingly more difficult with the increased number of circuit elements.

To achieve higher population capacities, circuit designers strive to reduce the size of the individual circuit elements to maximize available die real estate. The reduced size makes these circuit elements increasingly susceptible to defects caused by material impurities during fabrication. Nevertheless, the defects are identifiable upon completion of the integrated circuit fabrication by testing procedures, either at the semiconductor chip level or after complete packaging. Scrapping or discarding defective integrated circuits when defects are identified is economically undesirable, particularly if only a small number of circuit elements are actually defective.

Relying on zero defects in the fabrication of integrated circuits is an unrealistic option. Therefore, elements of a redundancy circuit are provided on integrated circuits to reduce the number of scrapped integrated circuits. If an element of the primary circuit is determined to be defective, an element of the redundancy is substituted for the defective element of the primary circuit. Substantial reductions in scrap are achieved by using elements of the redundancy circuit without substantially increasing the cost of the integrated circuits. Since the elements of the redundancy circuit are used to replace the defective elements of the primary circuit, a redundancy evaluation circuit is thus used to evaluate whether a fuse status address signal hits a defective element address signal.

Referring to FIG. 1, FIG. 1 is a circuit diagram of a conventional redundancy evaluation circuit for a semiconductor device. The semiconductor device is for example a semiconductor memory device. The redundancy evaluation circuit 1 comprises (m+1) fuse boxes 11, (m+1) multiplexers 12, a decoder 13, a comparator 14, and an enable transistor ENT, wherein m is a bit number of a defective element address signal AD (i.e. the defective element address signal has m bits A1 through Am).

Input ends of each multiplexer 12 are connected to output ends of the corresponding fuse box 11, m output ends of the m multiplexers 12 are connected to m first input ends of the comparator 14 respectively, an output end of the other one multiplexer 12 is connected to an enable end of the comparator 14. The comparator 14 further comprises m second input ends for receiving the defective element address signal AD and an output end for outputting a redundancy enable signal HIT. Each multiplexer 12 has k control ends connected to k output ends of the decoder 13, and the decoder has n input ends for receiving a circuit block address signal BA, wherein k is the number of circuit blocks (such as the memory blocks), n is the number of bits associated with the circuit block address signal BA, and $2^{n-1} < k \leq 2^n$. The enable transistor ENT is a NMOS transistor having a gate for receiving an enable signal EN, a source connected to a low reference voltage, such as a ground, and a drain connected to (m+1) reference ends of the (m+1) fuse boxes 11. Each of the fuse boxes 11 further has an input end for receiving a precharge signal PRE.

Each fuse box 11 comprises k redundant cells 111 through 11k. The redundant cell 111 comprises three PMOS transistors P11, P21, P31, a NMOS transistor N11, and a fuse $f_1$. A gate of the PMOS transistor P11 is connected to the input end of the corresponding fuse box 11, and a gate of the PMOS transistor P21 is connected to drains of the PMOS transistor P31 and NMOS transistor N11. Sources of the PMOS transistors P11 through P31 receive a supply voltage, such as a power voltage VDD, drains of the PMOS transistors P11 and P21 are connected to one end of the fuse $f_1$ and gates of the PMOS transistor P31 and the NMOS transistor N11. The other one end of the fuse $f_1$ is connected to the reference end of the corresponding fuse box 11. A source of the NMOS transistor N11 is connected to the low reference voltage, such as the ground. The drains of the PMOS transistor P31 and the NMOS transistor N11 are connected to one of the m input ends associated with the corresponding multiplexer 12. It is noted that the PMOS transistor P21 forms a voltage keeper, and the PMOS transistor P31 and the NMOS transistor N11 form an inverter, such that the PMOS transistor P21, P31, and the NMOS transistor N11 form an inverted latch. By the similar manner, the redundant cell 11k comprises three PMOS transistors P1k, P2k, P3k, a NMOS transistor N1k, and a fuse $f_k$, and the connection of the PMOS transistors P1k, P2k, P3k, the NMOS transistor N1k, and the fuse $f_k$ can be deduced from the above description of the redundant cell 111, thus omitting the redundant description.

A precharge signal PRE with a logic low level can be applied to the fuse boxes 11, such that nodes V1 through Vk of the redundant cells 111 through 11k in the fuse boxes 11 can be precharged, and the voltages of the nodes V1 through Vk are pulled up to the logic high level from the logic low level. Then, the precharge signal PRE goes to a logic high level from the logic low level, and the enable signal with the logic high level is applied to a gate of the enable transistor ENT. Thus, when the fuse $f_1$ is melted (i.e. the corresponding redundant element is used to replace the defective element), the node V1 goes to the logic low level, and the corresponding input end of the corresponding multiplexer receive the logic low level; by contrast, when the fuse f1 is not melted (i.e. the corresponding redundant element is not used to replace the defective element), the node V1 maintains the logic high level, and the corresponding input end of the corresponding multiplexer receive the logic high level. By similar manner, the status of the fuse $f_k$ affects the level at the node Vk, and the redundant description is thus omitted.

The decoder 13 decodes a circuit block address signal BA to generate k selection signals to control the multiplexer 12, such that the multiplexers 12 can output inversions of the (m+1) levels of the selected (m+1) redundant cells of the (m+1) fuse boxes 11. For example, the k selection signals select the redundant cells 111, and thus the multiplexers 12 output the inversions of the (m+1) levels at the (m+1) nodes V1 to the comparator 14, wherein the inversions of the m levels at the m nodes V1 are output as the fuse status address signal FS, and the inversion of the other one level at the node V1 is output as the comparator enable signal CEN. When the comparator 14 is enabled by the comparator enable signal CEN, the comparator 14 compares the fuse status address signal FS with defective element address signal AD, so as to output the redundancy enable signal HIT.

It is noted that one of the fuse box 11 is used to store the information whether the circuit block has the defective element replaced by the redundant element, and the multiplexer 12 connected to this fuse box 11 outputs the comparator enable signal CEN to enable the comparator when the circuit block has the defective element replaced by the redundant element.

Referring to FIG. 2, FIG. 2 is a layout diagram of the conventional redundancy evaluation circuit. The redundancy evaluation circuit 1 in FIG. 1 needs several multiplexers 12, several PMOS transistors P11 through P1$k$, P21 through P2$k$, P31 through P3$k$, and several NMOS transistors N11 through N1$k$, and thus the layout area of the redundancy evaluation circuit 1 is large. Moreover, due to the structure of redundancy evaluation circuit 1, the fuses are layout on the two fuse regions F1 and F2 with a spacing W, and the peripheral elements (such as transistors and multiplexers) are also layout on the two peripheral regions PH1 and PH2 with a spacing W. The width of the fuse regions F1, F2 and the peripheral regions PH1, PH2 is 8.5 W, the height of the fuse regions F1 and F2 is 2.5 H, and the height of the peripheral regions PH1 and PH2 is 3 H. Thus the layout area of redundancy evaluation circuit 1 is 99 HW.

SUMMARY

An exemplary embodiment of the present disclosure provides a redundancy evaluation circuit comprising (m+1) fuse boxes and a comparator, wherein m is a bit number of a defective element address signal. Each of the fuse boxes comprises a common stage circuit and k redundant cells. The common stage circuit has a precharge transistor and an inverted latch, wherein the precharge transistor is controlled by a precharge signal to pull up a common node to a logic high level, and the inverted latch outputs an inversion of a level at the common node. Each redundant cell has a transistor and a fuse, wherein a first and second ends of the transistor is connected to the common node and a low reference voltage through the fuse respectively, a gate of the transistor receive one of k selection signals, wherein k is a number of circuit blocks. The comparator enabled by a comparator enable signal compares a fuse status address signal and a defective element address signal to generate a redundancy enable signal, wherein the m fuse boxes output the m inversions of the m levels at the m common nodes thereof as the fuse status address signal, and the other one fuse box output the inversion of the level at the common node thereof as the comparator enable signal.

An exemplary embodiment of the present disclosure provides a semiconductor device comprising k circuit blocks, a redundancy circuit, and the above redundancy evaluation circuit. The redundancy circuit comprises a plurality of redundant elements for replacing the defective elements in the k circuit blocks.

To sum up, the redundancy evaluation circuit provided by an exemplary embodiment of the present disclosure can save multiplexers and several transistors, and thus the layout are can be dramatically reduced.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
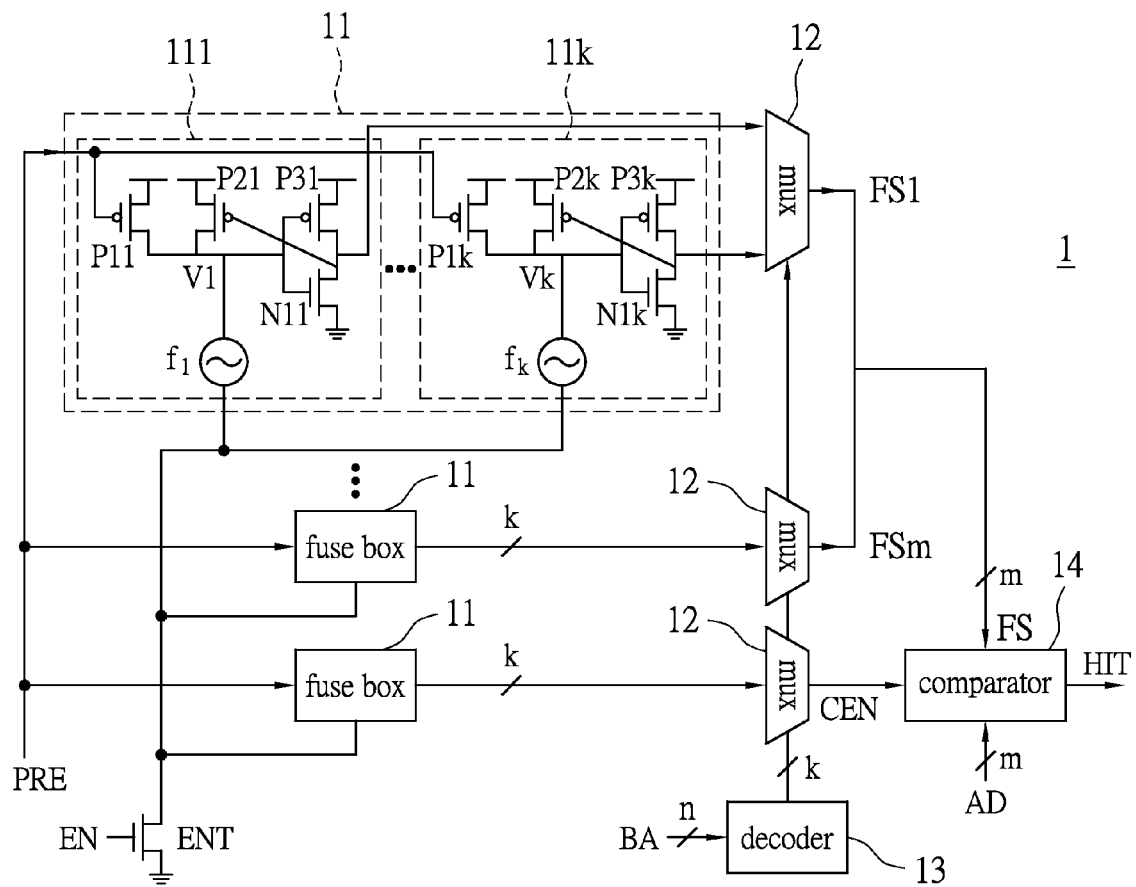
FIG. 1 is a circuit diagram of a conventional redundancy evaluation circuit for a semiconductor device.
Figure 2:
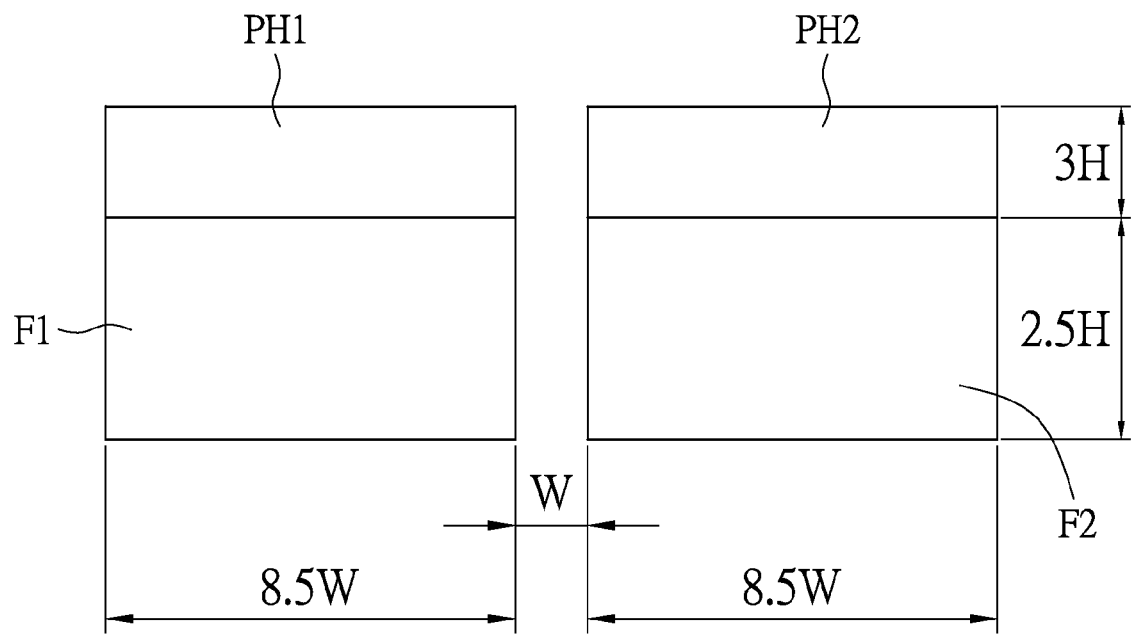
FIG. 2 is a layout diagram of the conventional redundancy evaluation circuit.

Reference will now be made in detail to the exemplary embodiments of the present disclosure, examples of which are illustrated in the accompanying drawings. Wherever possible, the same reference numbers are used in the drawings and the description to refer to the same or similar parts.

An exemplary embodiment of the present disclosure provides a redundancy evaluation circuit for a semiconductor device with less layout area than that of the conventional redundancy evaluation circuit. Furthermore, an exemplary embodiment of the present disclosure provides a semiconductor device having the redundancy evaluation circuit. In the exemplary embodiment of the present disclosure, several fuses in the fuse box share one latch and one precharge transistor, and thus several transistors are saved. Moreover, each fuse is connected to a selective transistor, and thus several multiplexers are also saved. Accordingly, the redundancy evaluation circuit has the small layout area. The details of the redundancy evaluation circuit are described as follows, but it is noted that the following exemplary embodiments are not used to limit the present disclosure.

Exemplary Embodiment of Redundancy Evaluation Circuit

Figure 3:
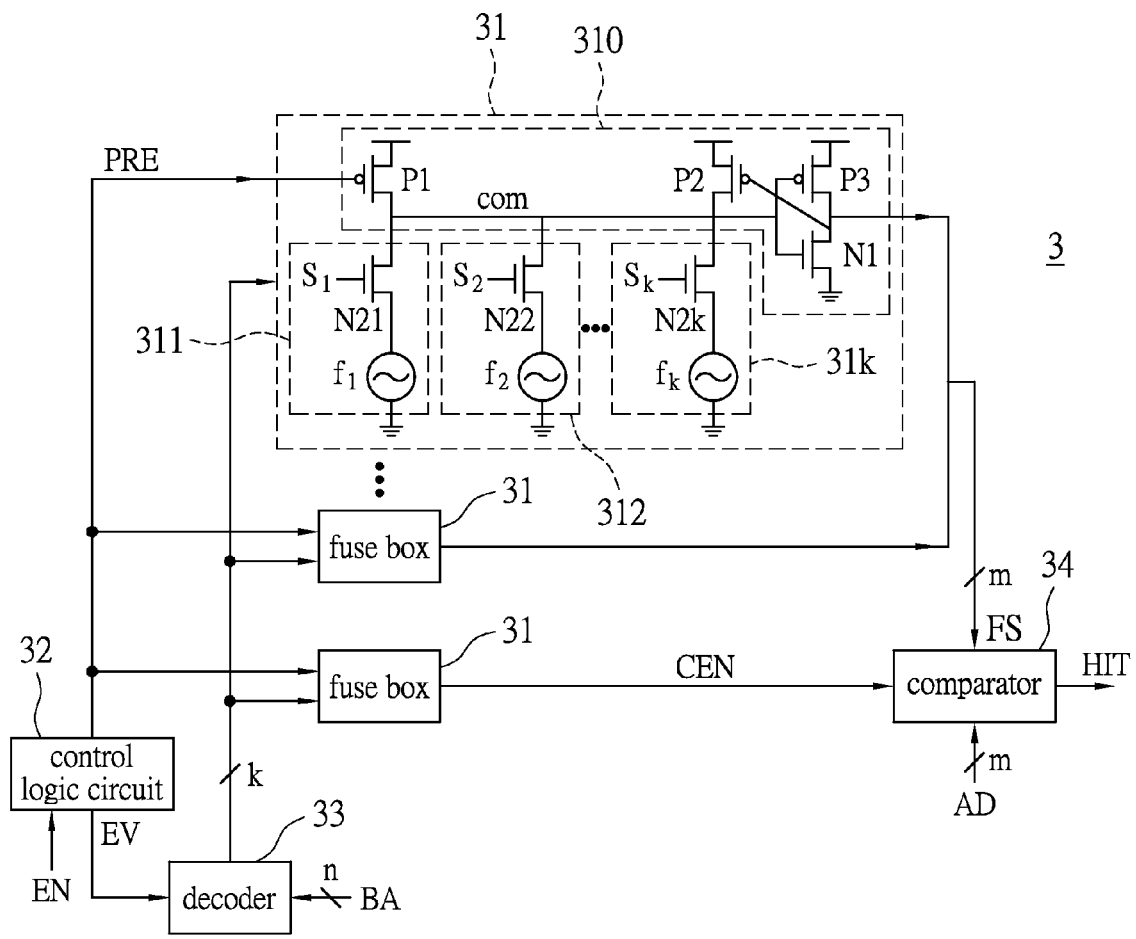
FIG. 3 is a circuit diagram of a redundancy evaluation circuit according to an exemplary embodiment of the present disclosure.

Referring to FIG. 3, FIG. 3 is a circuit diagram of a redundancy evaluation circuit according to an exemplary embodiment of the present disclosure. The redundancy evaluation circuit 3 can be used in the semiconductor device, such as the semiconductor memory device, and comprises (m+1) fuse boxes, a control logic circuit 32, a decoder 33, and a comparator 34, wherein m is a bit number of a defective element address signal AD (i.e. the defective element address signal has m bits A1 through Am).

Each fuse box 31 has k selection ends connected to k output ends of the decoder 33, m output ends of the m fuse box 31 are connected to m first input ends of the comparator 34, and an output end of the other one fuse box 31 is connected to an enable end of the comparator 34, wherein k is the number of circuit blocks (such as the memory blocks). The comparator 34 further has m second input ends for receiving the defective element address signal AD and an output end for outputting a redundancy enable signal HIT. The decoder 33 further has n input ends for receiving the circuit block address signal BA and an evaluation enable end connected to a second output end of the control logic circuit 32, wherein n is the number of bits associated with the circuit block address signal BA, and $2^{n-1} < k \leq 2^n$. The control logic circuit 32 has an input end for receiving an enable signal EN and a first output end connected to (m+1) precharge ends of the (m+1) fuse boxes 31.

Each of the fuse boxes 31 comprises a common stage circuit 310 and k redundant cells 311 through 31k. The common stage circuit 310 comprises three PMOS transistors P1 through P3 and a NMOS transistor N1. A gate of the PMOS transistor P1 is connected to first output end of the control logic circuit 32 for receiving a precharge signal PRE. A source of the PMOS transistor P1 receives a supply voltage, such as a power voltage VDD, and a drain of the PMOS transistor P1 is connected to the k redundant cells 311 through 31k. Thus, the PMOS transistor P1 is served as a precharge transistor shared by the k redundant cells 311 through 31k. Sources of the PMOS transistors P2 and P3 receive the supply voltage, and a source of the NMOS transistor is connected to a low reference voltage, such as the ground. Drains of the PMOS transistor P3 and the NMOS transistor N1 are connected to a gate of the PMOS transistor P2 and one of the m first input ends of the comparator 34. A drain of the PMOS transistor P2 and gates of the PMOS transistor P3 and the NMOS transistor N1 are connected to the k redundant cells 311 through 31k. It is noted that the PMOS transistor P2 forms a voltage keeper, and the PMOS transistor P3 and the NMOS transistor N1 form an inverter, such that the PMOS transistor P2, P3, and the NMOS transistor N1 form an inverted latch, and the inverted latch is shared by the k redundant cells 311 through 31k. Accordingly, the number of transistors in the fuse boxes 31 of the redundancy evaluation circuit 3 is less than that of the conventional redundancy evaluation circuit. That is, a node com of the common stage circuit 310 is connected to the k redundant cells 311 through 31k.

The redundant cell 311 comprises a NMOS transistor N21 and a fuse $f_1$. Two ends of the fuse $f_1$ are respectively connected to the low reference voltage and a source of the NMOS transistor N21. A gate of the NMOS transistor N2 is connected to one of the k output ends of the decoder 33 for receiving the selection signal $S_1$, and a drain of the NMOS transistor N21 is connected to the drains of the PMOS transistors P1, P2, and gates of the PMOS transistor P3 and the NMOS transistor N1. By the similar manner, the redundant cell 312 comprises a NMOS transistor N22 and a fuse $f_2$, and the redundant cell 31k comprises a NMOS transistor N2k and a fuse $f_k$. The connection of the NMOS transistor N22 and the fuse $f_2$ in the redundant cell 312 and the connection of the NMOS transistor N2k and the fuse $f_k$ in the redundant cell 31k can be deduced from the above description of the redundant cell 311, thus omitting the redundant description. Gates of the NMOS transistors N22, N2k in the redundant cell 312 and 31k receive the selection signals $S_2$ and $S_k$.

When an enable signal is applied to the control logic circuit 32, the control logic circuit 32 generate a precharge signal PRE with a logic low level to turn on the PMOS transistor P1 in the common stage circuit 310 of each fuse box 31, and thus the node com is pulled up to the logic high level from the logic low level. Then, the control circuit 32 makes the precharge signal goes to the logic high level from the logic low level to turn off the PMOS transistor P1, and outputs the evaluation enable signal EV to the decoder 33 to enable the decoder 33.

When the decoder 33 is enabled, the decoder 33 decodes the circuit block address signal BA to generate the k selection signals $S_1$ through $S_k$. The selection signals $S_1$ through $S_k$ are used to turn on the NMOS transistors N21 through N2k of the redundant cells 311 through 31k. For example, when the selection signal $S_1$ is the logic high level, and the other selection signals $S_2$ through $S_k$ are the logic low levels, the NMOS transistors N21 of the (m+1) redundant cells 311 respectively in the (m+1) fuse boxes 31 are turned on. Thus, m inversions of m levels at the m nodes com of the m fuse boxes 31 are output as the fuse status address signal FS to the comparator 34, and an inversion of an level at the node com of the other one fuse box 31 is output as the comparator enable signal to the comparator 34.

If the fuse $f_1$ is not melted, the corresponding node com is thus pulled down to the logic low level; by contrast, if the fuse $f_1$ is melted, the corresponding node com maintains the logic high level. That is, the fuse status address signal FS is used to present the statuses of the all fuse $f_1$ while the redundant cells 311 are selected. The other one fuse box 31 is used to store the condition whether the circuit block should be repaired, and thus this fuse box 31 outputs the comparator enable signal CEN to the comparator 34. When the comparator 34 is enabled, the comparator 34 compares the fuse status address signal FS with defective element address signal AD, so as to output the redundancy enable signal HIT.

It is noted that, since the block selection is implemented by the NMOS transistors N21 through N2k rather than the multiplexers, and the redundant cells 311 through 31k share the PMOS transistors P1 through P3 and the NMOS transistor N1 in each fuse box 31, the layout area of the redundancy evaluation circuit 3 is dramatically reduced.

Figure 4:
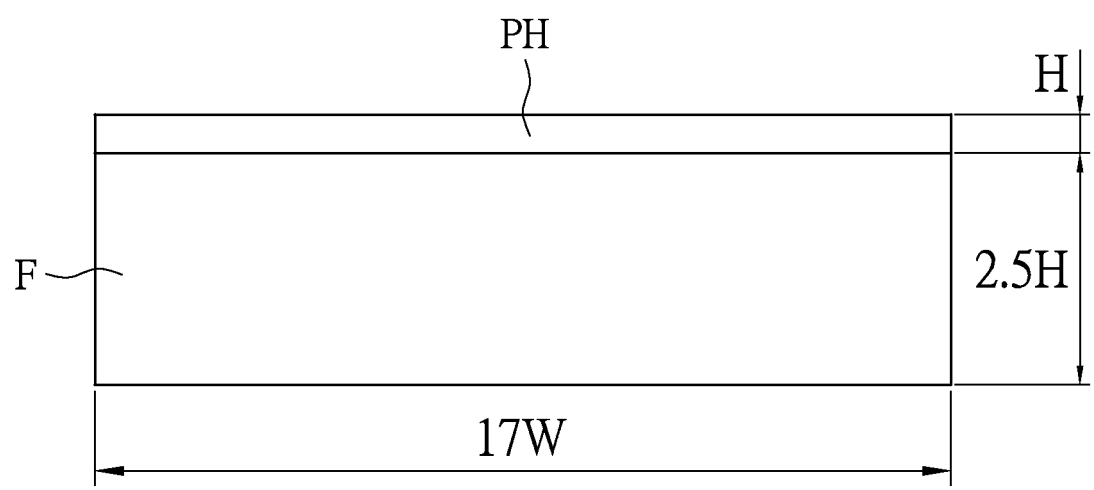
FIG. 4 is a layout diagram of a redundancy evaluation circuit according to an exemplary embodiment of the present disclosure.

Referring to FIG. 4, FIG. 4 is a layout diagram of a redundancy evaluation circuit according to an exemplary embodiment of the present disclosure. Since the multiplexers and several transistors are saved, the peripheral region PH on the layout area can be reduced. Furthermore, since only parts of fuses are enabled at bank activation, reliability of fuse status evaluation would not be degraded owing to ground bounce, and the fuse can be put in a compact manner without any spacing. That is, the fuses can be put on one fuse region F. The width of the fuse region F and the peripheral region PH is 17 W, and the heights of the fuse region F and the peripheral region PH are respectively 2.5 H and H. Thus, the layout area of redundancy evaluation circuit 3 is 59.5 HW, and compared to the conventional redundancy evaluation circuit, the redundancy evaluation circuit 3 save 40% area.

Exemplary Embodiment of Semiconductor Device

An exemplary embodiment of the present disclosure further provides a semiconductor device comprising the above redundancy evaluation circuit, a redundancy circuit, and the k circuit blocks. The redundancy circuit comprising a plurality of redundant elements for replacing the defective elements in the k circuit blocks. The redundancy evaluation circuit can generate the redundancy enable signal HIT to indicate that some redundant elements are now used to replace the defective elements in the circuit block.

Results of Exemplary Embodiment

To sum up, the redundancy evaluation circuit provided by an exemplary embodiment of the present disclosure can save multiplexers and several transistors, and thus the layout are can be dramatically reduced.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A redundancy evaluation circuit, comprising:
(m+1) fuse boxes, wherein m is a bit number of a defective element address signal, and each of the fuse boxes comprises:
    a common stage circuit, having a precharge transistor and an inverted latch, wherein the precharge transistor is controlled by a precharge signal to pull up a common node to a logic high level, and the inverted latch outputs an inversion of a level at the common node; and
    k redundant cells, each redundant cell has a transistor and a fuse, wherein a first and second ends of the transistor is connected to the common node and a low reference voltage through the fuse respectively, a gate of the transistor receive one of k selection signals, wherein k is a number of circuit blocks; and
a comparator, enabled by a comparator enable signal, comparing a fuse status address signal and a defective element address signal to generate a redundancy enable signal, wherein the m fuse boxes output the m inversions of the m levels at the m common nodes thereof as the fuse status address signal, and the other one fuse box output the inversion of the level at the common node thereof as the comparator enable signal; and
a control logic circuit, receiving an enable signal to generate the precharge signal to turn on the precharge transistors to pull up the common nodes of the (m+1) fuse boxes to the logic high level, then turn off the precharge transistors, and generate an evaluation enable signal; and
a decoder, enabled by the evaluation enable signal, decoding a circuit block address signal to output the k selection signal, wherein the circuit block address signal has n bits, and $2^{n-1} < k \leq 2^n$.

2. The redundancy evaluation circuit according to claim 1, wherein the transistor is a NMOS transistor, the first and second ends are the drain and source of the NMOS transistor, and the low reference voltage is a ground.

3. The redundancy evaluation circuit according to claim 1, wherein the precharge transistor is a PMOS transistor, a gate of the PMOS transistor receives the precharge signal, a source and a drain of the PMOS transistor are respectively connected a supply voltage and the common node.

4. The redundancy evaluation circuit according to claim 1, wherein the inverted latch comprises a first PMOS transistor, a second PMOS transistor, and a NMOS transistor, wherein sources of the first and second PMOS transistors are connected to a supply voltage, a gate of the first PMOS transistor is connected to drains of the second PMOS transistor and the NMOS transistor, a drain of the first PMOS transistor and gates of the second PMOS transistor and the NMOS transistor are connected to the common node, and a source of the NMOS transistor is connected to the low reference voltage.

5. A semiconductor device, comprising:
k circuit blocks, wherein k is a number of the circuit blocks;
a redundancy circuit, comprising a plurality of redundant elements for replacing the defective elements in the k circuit blocks; and
a redundancy evaluation circuit, comprising:
    (m+1) fuse boxes, wherein m is a bit number of a defective element address signal, and each of the fuse boxes comprises:
        a common stage circuit, having a precharge transistor and an inverted latch, wherein the precharge transistor is controlled by a precharge signal to pull up a common node to a logic high level, and the inverted latch outputs an inversion of a level at the common node; and
        k redundant cells, each redundant cell has a transistor and a fuse, wherein a first and second ends of the transistor is connected to the common node and a low reference voltage through the fuse respectively, a gate of the transistor receive one of k selection signals; and
    a comparator, enabled by a comparator enable signal, comparing a fuse status address signal and a defective element address signal to generate a redundancy enable signal, wherein the m fuse boxes output the m inversions of the m levels at the m common nodes thereof as the fuse status address signal, and the other one fuse box output the inversion of the level at the common node thereof as the comparator enable signal; and
    a control logic circuit, receiving an enable signal to generate the precharge signal to turn on the precharge transistors to pull up the common nodes of the (m+1) fuse boxes to the logic high level, then turn off the precharge transistors, and generate an evaluation enable signal; and
    a decoder, enabled by the evaluation enable signal, decoding a circuit block address signal to output the k selection signal, wherein the circuit block address signal has n bits, and $2^{n-1} < k \leq 2^n$.

6. The semiconductor device according to claim 5, wherein the transistor is a NMOS transistor, the first and second ends are the drain and source of the NMOS transistor, and the low reference voltage is a ground.

7. The semiconductor device according to claim 5, wherein the precharge transistor is a PMOS transistor, a gate of the PMOS transistor receives the precharge signal, a source and a drain of the PMOS transistor are respectively connected a supply voltage and the common node.

8. The semiconductor device according to claim 5, wherein the inverted latch comprises a first PMOS transistor, a second PMOS transistor, and a NMOS transistor, wherein sources of the first and second PMOS transistors are connected to a supply voltage, a gate of the first PMOS transistor is connected to drains of the second PMOS transistor and the NMOS transistor, a drain of the first PMOS transistor and gates of the second PMOS transistor and the NMOS transistor are connected to the common node, and a source of the NMOS transistor is connected to the low reference voltage.

* * * * *